United States Patent
Jung et al.

(10) Patent No.: US 11,758,761 B2
(45) Date of Patent: Sep. 12, 2023

(54) ORGANIC LIGHT EMITTING DISPLAY DEVICE

(71) Applicant: SAMSUNG DISPLAY CO., LTD., Yongin-si (KR)

(72) Inventors: Soonil Jung, Yongin-si (KR); Haeyoung Yun, Yongin-si (KR); Junghyun Cho, Yongin-si (KR); Sanghyun Choi, Yongin-si (KR)

(73) Assignee: Samsung Display Co., Ltd., Yongin-si (KR)

(*) Notice: Subject to any disclaimer, the term of this patent is extended or adjusted under 35 U.S.C. 154(b) by 127 days.

(21) Appl. No.: 16/868,217

(22) Filed: May 6, 2020

(65) Prior Publication Data

US 2020/0266390 A1  Aug. 20, 2020

Related U.S. Application Data

(63) Continuation of application No. 16/529,030, filed on Aug. 1, 2019, now Pat. No. 10,651,428, which is a (Continued)

(30) Foreign Application Priority Data

Nov. 28, 2017 (KR) .................. 10-2017-0160991

(51) Int. Cl.
*H01L 51/52* (2006.01)
*H01L 27/32* (2006.01)
(Continued)

(52) U.S. Cl.
CPC ......... *H10K 50/858* (2023.02); *G06F 3/0412* (2013.01); *G06F 3/0446* (2019.05);
(Continued)

(58) Field of Classification Search
CPC .. H01L 27/3246; H01L 27/323; G06F 3/0412
See application file for complete search history.

(56) References Cited

U.S. PATENT DOCUMENTS 6,072,450 A  6/2000 Yamada et al.
7,535,646 B2  5/2009 Chari et al.
(Continued)

FOREIGN PATENT DOCUMENTS

JP  2012-109214 A  6/2012
KR  10-2013-0008660 A  1/2013
(Continued)

OTHER PUBLICATIONS

"Refractive Index of Amorphous Polymers", polymerdatabase.com.*

*Primary Examiner* — Daniel Luke
(74) *Attorney, Agent, or Firm* — Lewis Roca Rothgerber Christie LLP

(57) ABSTRACT

An organic light emitting display device includes: a substrate; a first electrode on the substrate; a pixel defining layer on the substrate, the pixel defining layer defining a first opening which exposes at least a part of the first electrode; an organic light emitting layer on the first electrode; a second electrode on the organic light emitting layer; a thin film encapsulation layer on the second electrode; a sensing electrode on the thin film encapsulation layer; a low refractive index layer on the sensing electrode, the low refractive index layer defining a second opening which overlaps the first opening; and a high refractive index layer on the thin film encapsulation layer. A gap between an edge of the first opening and an edge of the second opening is constant irrespective of direction.

20 Claims, 12 Drawing Sheets

Related U.S. Application Data continuation of application No. 16/125,229, filed on Sep. 7, 2018, now Pat. No. 10,388,913.

(51) Int. Cl.

| | |
|---|---|
| *H10K 50/858* | (2023.01) |
| *H10K 59/40* | (2023.01) |
| *H10K 59/122* | (2023.01) |
| *H10K 59/35* | (2023.01) |
| *G06F 3/044* | (2006.01) |
| *H10K 50/813* | (2023.01) |
| *H10K 50/844* | (2023.01) |
| *H10K 50/856* | (2023.01) |
| *G06F 3/041* | (2006.01) |

(52) U.S. Cl.
CPC ......... *H10K 50/813* (2023.02); *H10K 50/844* (2023.02); *H10K 50/856* (2023.02); *H10K 59/122* (2023.02); *H10K 59/352* (2023.02); *H10K 59/353* (2023.02); *H10K 59/40* (2023.02)

(56) References Cited

U.S. PATENT DOCUMENTS

| | | | |
|---|---|---|---|
| 8,823,254 | B2 | 9/2014 | Ohta et al. |
| 8,921,840 | B2 | 12/2014 | Kim |
| 9,142,802 | B2 | 9/2015 | Miyamoto et al. |
| 9,293,735 | B2 | 3/2016 | Choi et al. |
| 9,368,757 | B2 | 6/2016 | Choi et al. |
| 9,978,821 | B2 * | 5/2018 | Tsai .................. H01L 27/32 |
| 10,310,650 | B2 * | 6/2019 | Heo ................... H01L 51/5284 |
| 2012/0104368 | A1 | 5/2012 | Isobe et al. |
| 2014/0339509 | A1 | 11/2014 | Choi et al. |
| 2015/0049030 | A1 | 2/2015 | Her |
| 2015/0333108 | A1 | 11/2015 | Miyamoto et al. |
| 2016/0087245 | A1 | 3/2016 | Park et al. |
| 2016/0378224 | A1 | 12/2016 | Kwon et al. |
| 2017/0227812 | A1 * | 8/2017 | Hao ................ G02F 1/133514 |
| 2018/0026079 | A1 * | 1/2018 | Lee ................... H01L 27/3246 257/40 |
| 2018/0138458 | A1 | 5/2018 | Tokuda |

FOREIGN PATENT DOCUMENTS

| | | | |
|---|---|---|---|
| KR | 10-2014-0135568 A | | 11/2014 |
| KR | 10-2014-0143916 A | | 12/2014 |
| KR | 20180046708 A | * | 5/2018 |
| WO | WO-2017195339 A1 | * | 11/2017 ........... G02F 1/1333 |

\* cited by examiner

ORGANIC LIGHT EMITTING DISPLAY DEVICE

CROSS-REFERENCE TO RELATED APPLICATIONS

This application is a continuation of U.S. patent application Ser. No. 16/529,030, filed Aug. 1, 2019, which is a continuation of U.S. patent application Ser. No. 16/125,229, filed Sep. 7, 2018, now U.S. Pat. No. 10,388,913, which claims priority to and the benefit of Korean Patent Application No. 10-2017-0160991, filed Nov. 28, 2017, the entire content of all of which is incorporated herein by reference.

BACKGROUND

1. Field

Exemplary embodiments relate to an organic light emitting display device, and more particularly, to an organic light emitting display device including a touch portion.

2. Discussion of the Related Art

Organic light emitting display devices (e.g., organic light emitting diode ("OLED") display devices) are self-light emitting display devices that display images using an OLED that emits light. The OLED display devices are currently garnering attention by virtue of their characteristics such as low power consumption, high luminance, high reaction speed, and the like.

Such OLED display devices have a multi-layer structure. For example, the OLED display devices may have a multi-layer structure including an OLED and a touch portion. When a light generated in the OLED is emitted to the outside, reflection, total reflection, or the like, of the light may occur at interfaces between layers due to such a multilayer structure. Part of the light generated in the OLED may be extinguished by such reflection, total reflection, or the like, of the light. Thus, light emission efficiency and display quality of the OLED display device may be degraded.

It is to be understood that this background of the technology section is intended to provide useful background for understanding the technology and as such disclosed herein, the technology background section may include ideas, concepts or recognitions that were not part of what was known or appreciated by those skilled in the pertinent art prior to a corresponding effective filing date of subject matter disclosed herein.

SUMMARY

According to an embodiment, an organic light emitting display device includes: a substrate; a first electrode on the substrate; a pixel defining layer on the substrate, the pixel defining layer defining a first opening which exposes at least a part of the first electrode; an organic light emitting layer on the first electrode; a second electrode on the organic light emitting layer; a thin film encapsulation layer on the second electrode; a sensing electrode on the thin film encapsulation layer; a low refractive index layer on the sensing electrode, the low refractive index layer defining a second opening which overlaps the first opening; and a high refractive index layer on the thin film encapsulation layer. A gap between an edge of the first opening and an edge of the second opening is constant irrespective of direction.

The first opening may have a shape substantially the same as a shape of the second opening on a plane.

A size of the first opening may be less than a size of the second opening on a plane.

Each of the edge of the first opening and the edge of the second opening may form a closed loop, and the closed loop may have a substantially circular, rhombic or octagonal shape on a plane.

The gap between the edge of the first opening and the edge of the second opening is between about 0.5 μm to about 5.0 μm on a plane.

The gap between the edge of the first opening and the edge of the second opening may be about 1 μm on a plane.

An interface between the low refractive index layer and the high refractive index layer may form an angle ranging from about 40° to about 70° with respect to a straight line parallel to the substrate.

The low refractive index layer may overlap the pixel defining layer.

The high refractive index layer may be disposed on the low refractive index layer.

The high refractive index layer may have a height substantially equal to a height of the low refractive index layer.

The low refractive index layer may have a refractive index between about 1.40 to about 1.59.

The high refractive index layer may have a refractive index between from about 1.60 to about 1.80.

The sensing electrode may include a first sensing electrode and a second sensing electrode crossing each other on a plane.

The sensing electrode may have a mesh shape on a plane.

According to an embodiment, an organic light emitting display device includes; a substrate; a plurality of first electrodes on the substrate; a pixel defining layer on the substrate, the pixel defining layer defining a plurality of first openings which expose at least a part of the plurality of first electrodes, respectively; a red light emitting layer, a green light emitting layer, and a blue light emitting layer respectively on the plurality of first electrodes; a second electrode on the red light emitting layer, the green light emitting layer, and the blue light emitting layer; a thin film encapsulation layer on the second electrode; a sensing electrode on the thin film encapsulation layer; a low refractive index layer on the sensing electrode, the low refractive index layer defining a plurality of second openings which overlap the plurality of first openings, respectively; and a high refractive index layer on the thin film encapsulation layer. Each of a first gap between an edge of the first opening overlapping the red light emitting layer and an edge of the second opening overlapping the red light emitting layer, a second gap between an edge of the first opening overlapping the green light emitting layer and an edge of the second opening overlapping the green light emitting layer, and a third gap between an edge of the first opening overlapping the blue light emitting layer and an edge of the second opening overlapping the blue light emitting layer is constant irrespective of direction.

Each of the first gap, the second gap, and the third gap may be in between about 0.5 μm to about 5.0 μm.

A ratio between the first gap, the second gap, and the third gap may be about 1:1:1.

Each of the first gap, the second gap, and the third gap may be about 1 μm.

A ratio between the first gap, the second gap, and the third gap may be about 1:2:1.

An interface between the low refractive index layer and the high refractive index layer may form an angle ranging from about 40° to about 70° with respect to a straight line parallel to the substrate.

The foregoing is illustrative only and is not intended to be in any way limiting. In addition to the illustrative aspects, exemplary embodiments and features described above, further aspects, exemplary embodiments and features will become apparent by reference to the drawings and the following detailed description.

BRIEF DESCRIPTION OF THE DRAWINGS

Features will become apparent to those of skill in the art by describing in detail exemplary embodiments with reference to the attached drawings in which.

DETAILED DESCRIPTION

Figure 1:
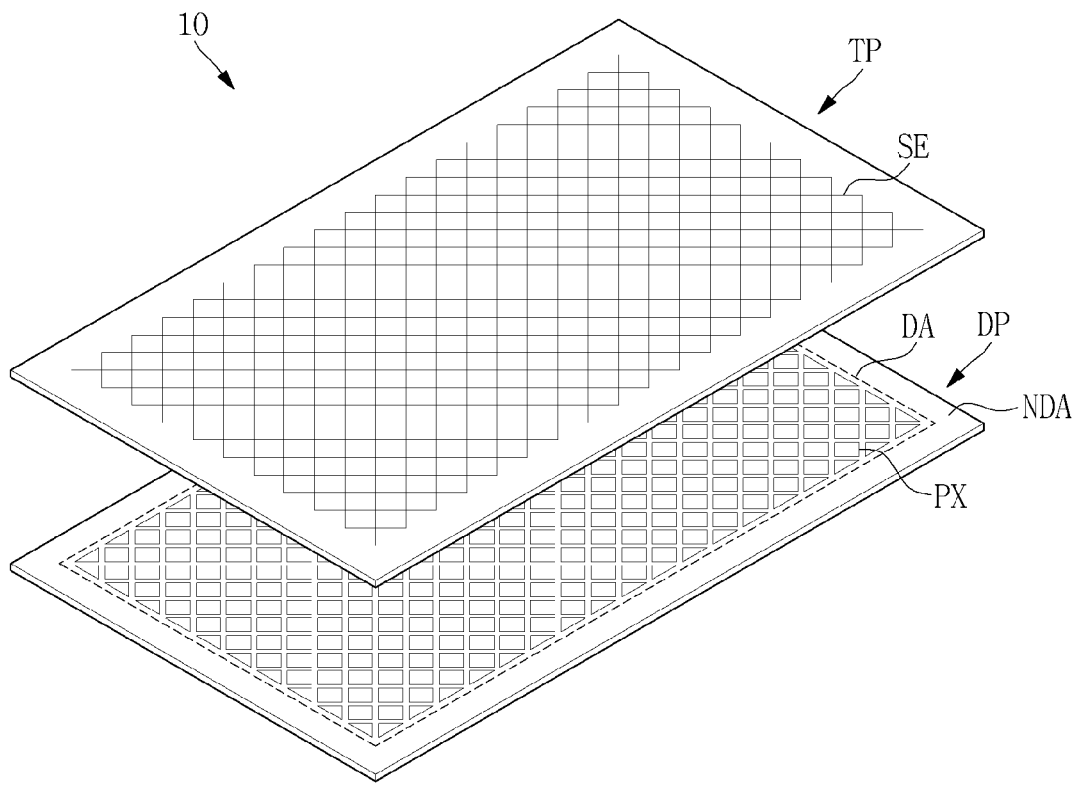
FIG. 1 illustrates a perspective view of an organic light emitting diode ("OLED") display device according to an exemplary embodiment.

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey exemplary implementations to those skilled in the art.

In the drawings, thicknesses of a plurality of layers and areas are illustrated in an enlarged manner for clarity and ease of description thereof. When a layer, area, or plate is referred to as being "on" another layer, area, or plate, it may be directly on the other layer, area, or plate, or intervening layers, areas, or plates may be present therebetween. Conversely, when a layer, area, or plate is referred to as being "directly on" another layer, area, or plate, intervening layers, areas, or plates may be absent therebetween. Further when a layer, area, or plate is referred to as being "below" another layer, area, or plate, it may be directly below the other layer, area, or plate, or intervening layers, areas, or plates may be present therebetween. Conversely, when a layer, area, or plate is referred to as being "directly below" another layer, area, or plate, intervening layers, areas, or plates may be absent therebetween.

The spatially relative terms "below", "beneath", "lower", "above", "upper" and the like, may be used herein for ease of description to describe the relations between one element or component and another element or component as illustrated in the drawings. It will be understood that the spatially relative terms are intended to encompass different orientations of the device in use or operation, in addition to the orientation illustrated in the drawings. For example, in the case where a device illustrated in the drawing is turned over, the device positioned "below" or "beneath" another device may be placed "above" another device. Accordingly, the illustrative term "below" may include both the lower and upper positions. The device may also be oriented in the other direction and thus the spatially relative terms may be interpreted differently depending on the orientations.

Throughout the specification, when an element is referred to as being "connected" to another element, the element is "directly connected" to the other element, or "electrically connected" to the other element with one or more intervening elements interposed therebetween. It will be further understood that the terms "comprises," "comprising," "includes" and/or "including," when used in this specification, specify the presence of stated features, integers, steps, operations, elements, and/or components, but do not preclude the presence or addition of one or more other features, integers, steps, operations, elements, components, and/or groups thereof.

It will be understood that, although the terms "first," "second," "third," and the like may be used herein to describe various elements, these elements should not be limited by these terms. These terms are only used to distinguish one element from another element. Thus, "a first element" discussed below could be termed "a second element" or "a third element," and "a second element" and "a third element" may be termed likewise without departing from the teachings herein.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" may mean within one or more standard deviations, or within ±30%, 20%, 10%, 5% of the stated value.

Unless otherwise defined, all terms used herein (including technical and scientific terms) have the same meaning as commonly understood by those skilled in the art to which this disclosure pertains. It will be further understood that terms, such as those defined in commonly used dictionaries, should be interpreted as having a meaning that is consistent with their meaning in the context of the relevant art and will not be interpreted in an ideal or excessively formal sense unless clearly defined at the present specification.

Some of the parts which are not associated with the description may not be provided in order to specifically describe exemplary embodiments and like reference numerals refer to like elements throughout the specification.

Hereinafter, an exemplary embodiment will be described with reference to FIGS. 1 to 8.

Figure 2:
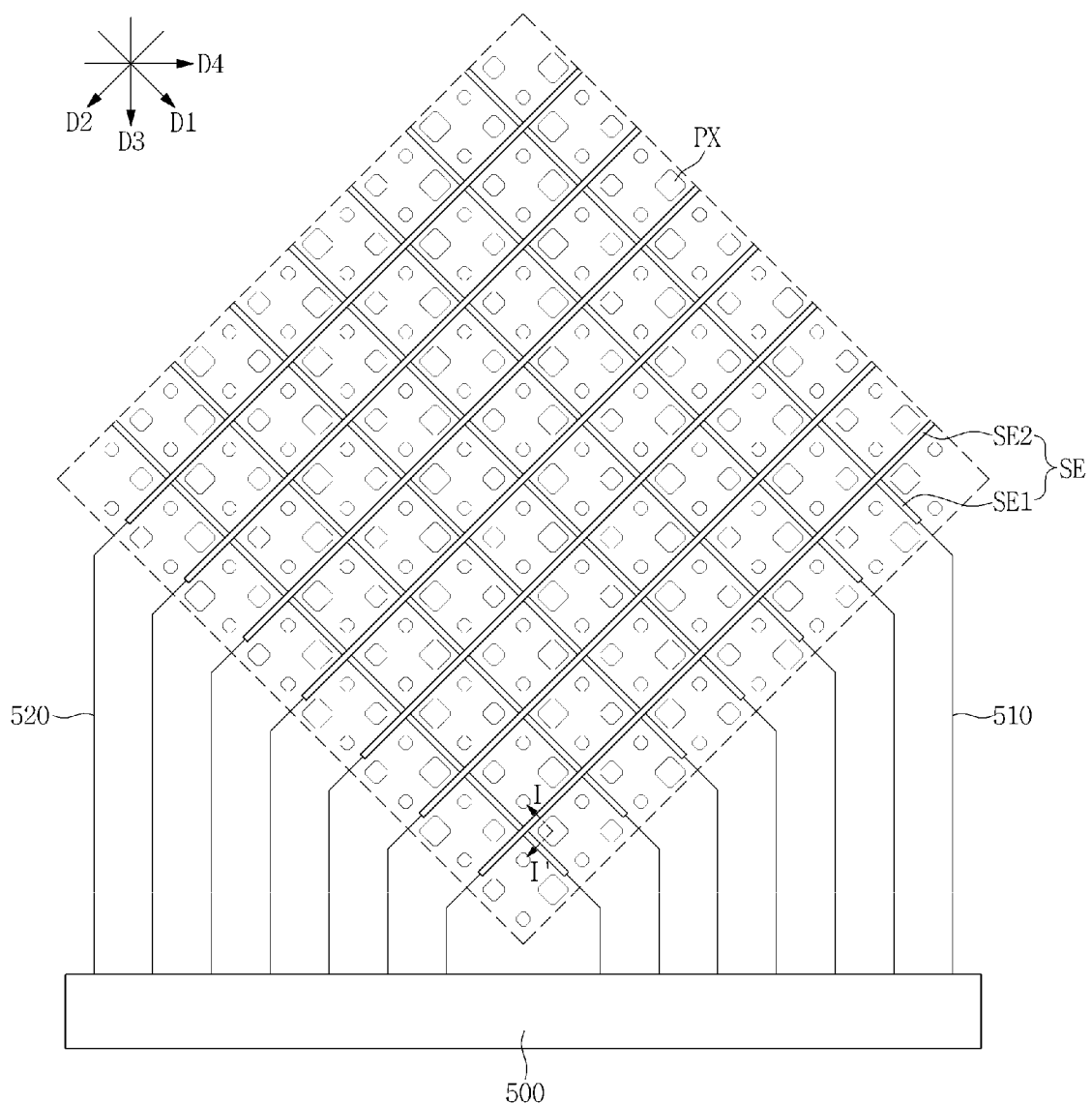
FIG. 2 illustrates a plan view enlarging a partial area of FIG. 1.

FIG. 1 illustrates a perspective view of an organic light emitting diode ("OLED") display device according to an exemplary embodiment. FIG. 2 is a plan view enlarging a partial area of FIG. 1.

Referring to FIG. 1, an OLED display device 10 according to an exemplary embodiment includes a display portion DP and a touch portion TP. Herein, the display portion DP and the touch portion TP are illustrated as being separated from each other, for convenience of explanation. However, the display portion DP and the touch portion TP may be a unitary structure (i.e., a monolithic structure). In particular, the OLED display device 10 according to an exemplary embodiment is described under the assumption that it has an on-cell structure in which the touch portion TP is directly on the display portion DP without a separate substrate. Alternatively, the OLED display device 10 may have an in-cell structure in which the touch portion TP is formed in the display portion DP.

The display portion DP may be divided into a display area DA and a non-display area NDA. The display portion DP includes a plurality of pixels PX arranged in a matrix form in the display area DA. Each of the plurality of pixels PX is illustrated as having a substantially rhombic shape. Alternatively, the plurality of pixels PX may each have various shapes, e.g., substantially circular or polygonal shapes.

The touch portion TP is on the display portion DP. The touch portion TP includes at least one sensing electrode SE for detecting a touch input and touch coordinates.

Referring to FIG. 2, the sensing electrode SE according to an exemplary embodiment includes a first sensing electrode SE1 that extends in a first direction D1 and a second sensing electrode SE2 that extends in a second direction D2 intersecting the first direction D1. The first sensing electrode SE1 and the second sensing electrode SE2 may be disposed so as to surround the plurality of pixels PX on a plane.

For example, as illustrated in FIG. 2, four pixels PX defining one pixel group may be surrounded by the first sensing electrode SE1 and the second sensing electrode SE2. Alternatively, the first sensing electrode SE1 and the second sensing electrode SE2 may be disposed in a manner to surround a different number of pixels, e.g., one pixel PX, on a plane. The accuracy of touch sensing may vary depending on the density of the first sensing electrode SE1 and the second sensing electrode SE2.

In addition, although the first sensing electrode SE1 and the second sensing electrode SE2 are illustrated as having a mesh electrode shape on a plane. Alternatively, each of the first sensing electrode SE1 and the second sensing electrode SE2 may have a planar electrode shape.

Each of the first sensing electrode SE1 and the second sensing electrode SE2 may include a metal or transparent conductive oxide (TCO). Such TCO may include at least one of: indium tin oxide (ITO), indium zinc oxide (IZO), zinc oxide (ZnO), carbon nanotube (CNT), or graphene.

The first sensing electrode SE1 is electrically connected to a first routing wiring 510, and the second sensing electrode SE2 is electrically connected to a second routing wiring 520. Each of the first routing wiring 510 and the second routing wiring 520 may extend along a third direction D3.

Each of the first routing wiring 510 and the second routing wiring 520 is connected to a touch driver 500, e.g., a single touch driver 500. Alternatively, each of the first routing wiring 510 and the second routing wiring 520 may be connected to respective separate touch drivers 500.

The touch driver 500 may input a driving signal to the first sensing electrode SE1, and may determine the presence of a touch input and touch coordinates based on a capacitance variation or a voltage variation measured by the second sensing electrode SE2. The touch driver 500 may be directly on the substrate, e.g., as an integrated circuit (IC), or may have a separate structure.

Figure 3:
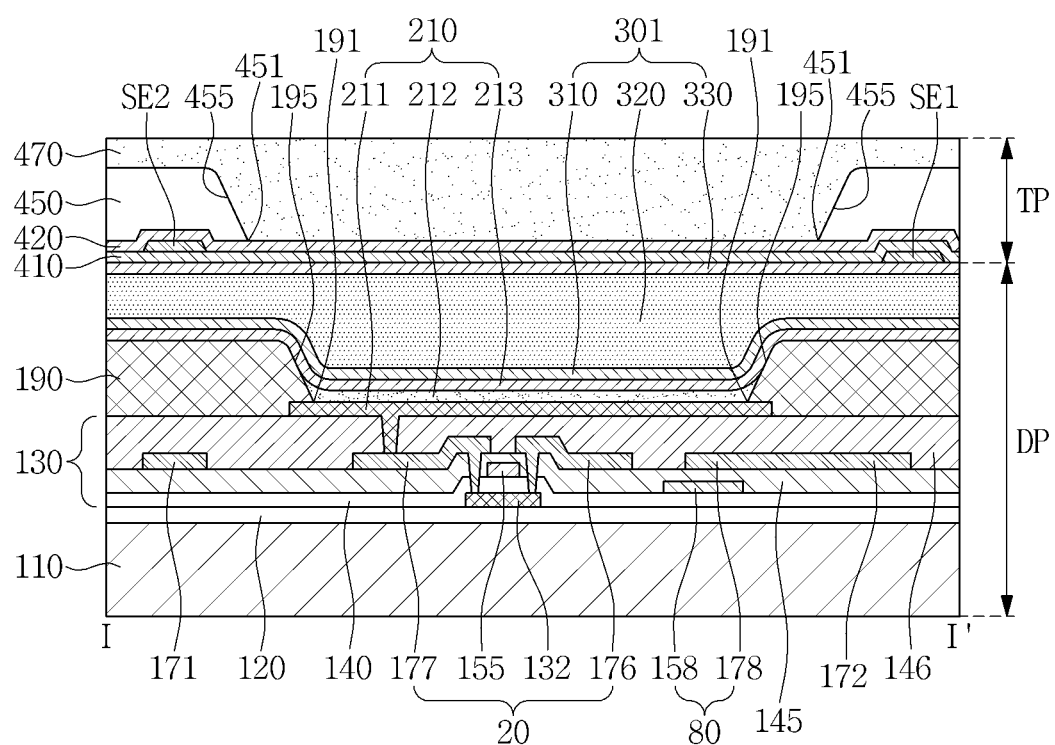
FIG. 3 illustrates a cross-sectional view taken along line I-I' of FIG. 2.
Figure 4:
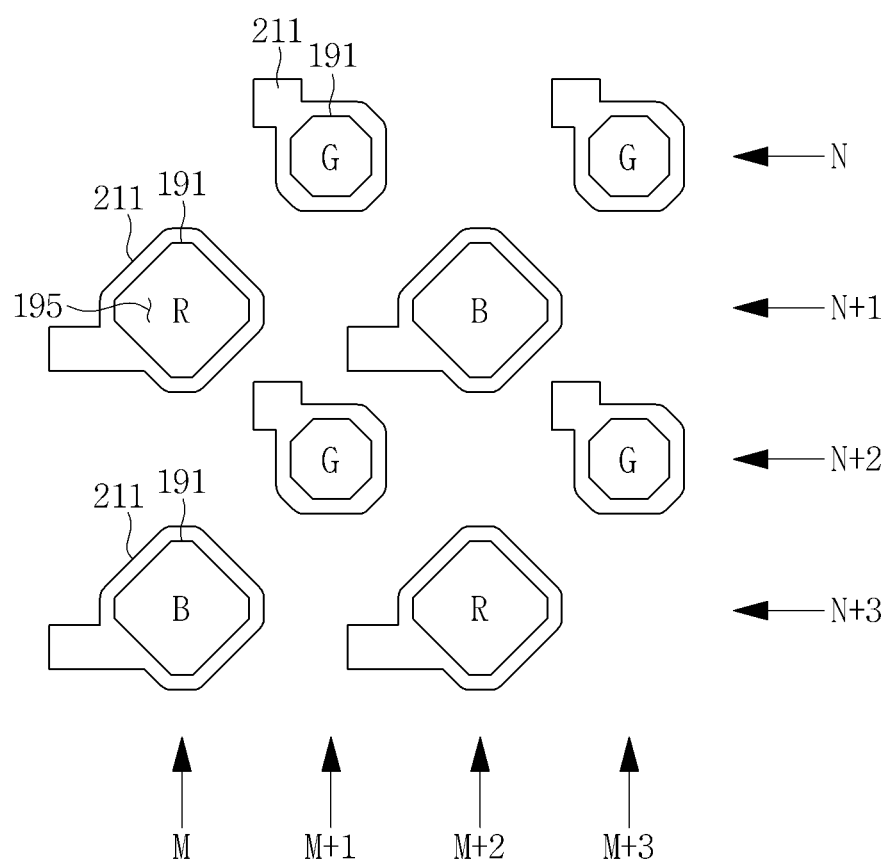
FIG. 4 illustrates a plan view schematically of a plurality of first electrodes and a plurality of first openings according to an exemplary embodiment.

FIG. 3 is a cross-sectional view taken along line I-I' of FIG. 2. FIG. 4 is a plan view schematically illustrating a plurality of first electrodes and a plurality of first openings according to an exemplary embodiment.

Referring to FIG. 3, the OLED display device 10 according to an exemplary embodiment includes a display portion DP and a touch portion TP on the display portion DP. The display portion DP includes a substrate 110, a driving circuit 130, a pixel defining layer 190, an OLED 210, and a thin film encapsulation layer 301 stacked along a stacking direction.

The substrate 110 may include or be formed of an insulating material, e.g., glass, quartz, ceramics, plastic, and the like. The material for the substrate 111 may be selected, e.g., from materials which are excellent in mechanical strength, thermal stability, transparency, surface smoothness, ease of handling, water resistance, or the like.

A buffer layer 120 may be on the substrate 110. The buffer layer 120 may include one or more layers selected from various inorganic layers and organic layers. The buffer layer 120 serves to substantially prevent permeation of undesirable elements such as impurities or moisture into the driving circuit 130 or the OLED 210 and to planarize a surface therebelow.

The driving circuit 130 may be on the buffer layer 120. The driving circuit 130 corresponds to a portion including a plurality of thin film transistors ("TFTs") 20 and a capacitor 80, and drives the OLED 210. In addition, the driving circuit 130 includes a gate line extending along one direction, and a data line 171 and a common power line 172 insulated from and intersecting the gate line. The OLED 210 emits light according to the driving signal received from the driving circuit 130 to display images.

The OLED display device 10 according to an exemplary embodiment may have a 2Tr-1Cap structure in which two thin film transistors (TFTs) 20 and one capacitor 80 are provided in one pixel PX. Alternatively, one pixel PX may have various structures, e.g., three or more TFTs 20 and two or more capacitors 80.

The capacitor 80 includes a pair of capacitor plates 158 and 178 with an insulating interlayer 145 interposed therebetween. In such an exemplary embodiment, the insulating interlayer 145 may be a dielectric element. A capacitance of the capacitor 80 is determined by electric charges accumulated in the capacitor 80 and a voltage between the pair of capacitor plates 158 and 178.

The TFT 20 includes a semiconductor layer 132, a gate electrode 155, a source electrode 176, and a drain electrode 177. The semiconductor layer 132 is insulated from the gate electrode 155 by a gate insulating layer 140. The TFT 20 applies, to a first electrode 211, a driving power for emitting a light from an organic light emitting layer 212 of an OLED 210 in a selected pixel PX. In such an exemplary embodiment, the gate electrode 155 is connected to a capacitor plate 158, each of the driving source electrode 176 and another capacitor plate 178 is connected to the common power line 172, and the driving drain electrode 177 is connected to the first electrode 211 of the OLED 210 through a contact hole defined at the planarization layer 146.

The planarization layer 146 is on the insulating interlayer 145. The planarization layer 146 includes or is formed of an insulating material and protects the driving circuit 130. The planarization layer 146 and the insulating interlayer 145 may include or be formed of a substantially same material.

The first electrode 211 is disposed on the planarization layer 146. The first electrode 211 may be a pixel electrode and may be an anode. The first electrode 211 has conductivity and may be one of a transmissive electrode, a transflective electrode or a reflective electrode.

When the first electrode 211 is a transmissive electrode, the first electrode 211 includes transparent conductive oxide ("TCO"). For example, at least one of indium tin oxide (ITO), indium zinc oxide (IZO), zinc oxide (ZnO) and indium tin zinc oxide (ITZO) may be used as TCO, for example. When the first electrode 211 is a transflective electrode or a reflective electrode, the first electrode 211 may include at least one of Ag, Mg, Al, Pt, Pd, Au, Ni, Nd, Ir, Cr, and Cu.

The pixel defining layer 190, which divides, e.g., defines, a light emission area, is on the planarization layer 146. In such an exemplary embodiment, the light emission area is also referred to as a pixel area. The pixel defining layer 190 may include or be formed of a polymer organic material. For example, the pixel defining layer 190 may include at least one of a polyimide (PI)-based resin, a polyacrylic resin, a polyethylene terephthalate (PET) resin, and a polyethylene naphthalate (PEN) resin.

The pixel defining layer 190 defines a first opening 195 exposing at least a portion of the first electrode 211. The first electrode 211 overlaps at least a portion of the pixel defining layer 190 and does not overlap the pixel defining layer 190 at the first opening 195. The first opening 195 may be defined as an area above the first electrode 211 that does not overlap the pixel defining layer 190 along the stacking direction. In addition, a boundary at which the pixel defining layer 190 contacts the first electrode 211 at the first opening 195 is defined as an edge 191 of the first opening 195.

In particular, referring to FIG. 4, the pixel defining layer 190 defines the plurality of first openings 195 respectively corresponding to the plurality of pixels PX. The plurality of pixels PX include a red pixel R for emitting red light, a green pixel G for emitting green light, and a blue pixel B for emitting blue light. In such an exemplary embodiment, the red OLED 210 of the red pixel R includes a red light emitting layer, the green OLED 210 of the green pixel G includes a green light emitting layer, and the blue OLED 210 of the blue pixel B includes a blue light emitting layer. Alternatively, the plurality of pixels PX may include pixels each emitting light having white, cyan, magenta, or yellow colors.

The edges 191 of the plurality of first openings 195 may each have a shape similar to that of the body of the first electrode 211 on a plane. For example, as illustrated in FIG. 4, each of the edge 191 of the first opening 195 and the first electrode 211 may have a substantially octagonal shape similar to a rhombus on a plane.

In such an exemplary embodiment, the plurality of first electrodes 211 each corresponding to the red pixel R, the green pixel G, and the blue pixel B may have sizes different from each other on a plane. Similarly, the plurality of first openings 195 each corresponding to the red pixel R, the green pixel G, and the blue pixel B may have sizes different from each other on a plane. For example, as illustrated in FIG. 4, the first opening 195 and the first electrode 211 corresponding to the red pixel R may have size larger than the size of the first opening 195 and the first electrode 211 corresponding to the green pixel G, respectively, and may have size less than or substantially equal to the size of the first opening 195 and the first electrode 211 corresponding to the blue pixel B, respectively. However, exemplary embodiments are not limited thereto, and each of the first opening 195 and the first electrode 211 may have various size.

In addition, the OLED display device 10 according to an exemplary embodiment may have a pentile structure. For example, as illustrated in FIG. 4, a plurality of first electrodes 211 corresponding to the green light emitting layer may be spaced apart from each other by a predetermined distance in an N-th row. First electrodes 211 corresponding to the red light emitting layer and first electrodes 211 corresponding to the blue light emitting layer may be alternately disposed in an (N+1)-th row, adjacent to the N-th row. Similarly, a plurality of first electrodes 211 corresponding to the green light emitting layer may be spaced apart from each other by a predetermined distance in an (N+2)-th row, adjacent to the (N+1)-th row. The first electrodes 211 corresponding to the red light emitting layer and first electrodes 211 corresponding to the blue light emitting layer may be alternately disposed in an (N+3)-th row, adjacent to the (N+2)-th row.

In addition, the first electrodes 211 corresponding to the plurality of green light emitting layers in the N-th row may be alternately arranged with the first electrodes 211 corresponding to the plurality of red and blue light emitting layers that are in the (N+1)-th row. For example, the first electrodes 211 corresponding to the plurality of red and blue light emitting layers may be alternately arranged in an M-th column, while the first electrodes 211 corresponding to the plurality of green light emitting layers may be spaced apart from each other by a predetermined distance in an (M+1)-th column, adjacent to the M-th column. Similarly, the first electrodes 211 corresponding to the plurality of red and blue light emitting layers may be alternately arranged in an (M+2)-th column, adjacent to the (M+1)-th column, while the first electrodes corresponding to the plurality of green light emitting layers may be spaced apart from each other by a predetermined distance in an (M+3)-th column, adjacent to the (M+2)-th column. That is, the plurality of first electrodes may be repeatedly disposed on the substrate 110 in the above-described structure.

Referring back to FIG. 3, the organic emitting layer 212 may be on the first electrode 211. Specifically, the organic light emitting layer 212 is at the first opening 195 on the first electrode 211, e.g., may contact the first electrode 211 and may extend along the first opening 195. The organic emitting layer 212 may be on a sidewall of the pixel defining layer 190 which defines the first opening 195 and on the pixel defining layer 190.

The organic light emitting layer 212 includes a light emitting material. In addition, the organic light emitting layer 212 may include a host and a light emitting dopant. The organic light emitting layer 212 may be manufactured by a known method, using a known material. For example, the organic light emitting layer 212 may be formed through various methods such as a vacuum deposition method, a spin coating method, a cast method, a Langmuir-Blodgett (LB) method, an inkjet printing method, a laser printing method, a laser induced thermal imaging (LITI) method, and the like.

A second electrode 213 is on the organic light emitting layer 212. The second electrode 213 may cover, e.g., completely cover, the organic light emitting layer 212 and may extend along sidewalls to upper surfaces of the pixel defining layer 190. The second electrode 213 may be a common electrode and may be a cathode. The second electrode 213 may be a transmissive electrode, a transflective electrode, or a reflective electrode.

When the second electrode 213 is a transmissive electrode, the second electrode 213 may include at least one of Li, Ca, LiF/Ca, LiF/Al, Al, Mg, BaF, Ba, Ag, and Cu. For example, the second electrode 213 may include a mixture of Ag and Mg. When the second electrode 213 is a transflective electrode or a reflective electrode, the second electrode 213 may include at least one of Ag, Mg, Al, Pt, Pd, Au, Ni, Nd, Ir, Cr, Li, Ca, LiF/Ca, LiF/Al, Mo, Ti and Cu. In addition, the second electrode 213 may further include a TCO layer which includes, for example, indium tin oxide (ITO), indium zinc oxide (IZO), zinc oxide (ZnO), and indium-zinc-tin oxide (IZTO), in addition to the transflective electrode or the reflective electrode.

At least one of a hole injection layer (HIL) and a hole transport layer (HTL) may be between the first electrode 211 and the organic light emitting layer 212. At least one of an electron transport layer (ETL) and an electron injection layer (EIL) may be between the organic light emitting layer 212 and the second electrode 213.

When the OLED 210 is a top emission type, the first electrode 211 may be a reflective electrode and the second electrode 213 may be a transmissive electrode or a transflective electrode. When the OLED 210 is a bottom emission type, the first electrode 211 may be a transmissive electrode or a transflective electrode, and the second electrode 213 may be a reflective electrode. According to an exemplary embodiment, the OLED 210 may be a top emission type, the first electrode 211 may be a reflective electrode, and the second electrode 213 may be a transflective electrode.

A thin film encapsulation layer 301 may be on the second electrode 213 to protect the OLED 210. The thin film encapsulation layer 301 substantially prevents an outside air such as moisture or oxygen from penetrating into the OLED 210.

The thin film encapsulation layer 301 includes at least one inorganic layer 310 and 330, and at least one organic layer 320 alternately arranged with the at least one inorganic layer 310 and 330. Referring to FIG. 3, the thin film encapsulation layer 301 according to an exemplary embodiment is illustrated as including two inorganic layers 310 and 330, and one organic layer 320. Alternatively, additional alternating layers may be included.

The inorganic layers 310 and 330 include one or more inorganic materials of: $Al_2O_3$, $TiO_2$, $ZrO$, $SiO_2$, AlON, AlN, SiON, $Si_3N4$, ZnO, and $Ta_2O_5$. The inorganic layers 310 and 330 may be formed through methods such as a chemical vapor deposition (CVD) method or an atomic layer deposition (ALD) method. However, exemplary embodiments are not limited thereto, and the inorganic layers 310 and 330 may be formed through various methods known to those skilled in the pertinent art.

The organic layer 320 may include or be formed of a polymer-based material. Examples of the polymer-based material may include, e.g., an acrylic resin, an epoxy resin, polyimide, and polyethylene. The organic layer 320 may be formed through a thermal deposition process. The thermal deposition process for forming the organic layer 320 may be performed in a range of temperature that may not damage the OLED 210. Alternatively, the organic layer 320 may be formed through various methods known to those skilled in the pertinent art.

The inorganic layers 310 and 330 which have a high density of thin film may substantially prevent or efficiently reduce permeation of contaminants, e.g., moisture or oxygen. Contaminants that have passed through the inorganic layers 310 and 330 may further be blocked by the organic layer 320. The organic layer 320 may have relatively low permeation prevention efficiency as compared to the inorganic layers 310 and 330. However, the organic layer 320 may also serve as a buffer layer to reduce stress between the inorganic layers 310 and 330, in addition to the preventing contamination. Further, since the organic layer 320 has planarizing characteristics, an uppermost surface of the thin film encapsulation layer 301 may be planarized by the organic layer 320.

The thin film encapsulation layer 301 may have a thickness in a range from about 5 μm to about 50 μm. When the thickness of the thin film encapsulation layer 301 is less than about 5 μm or exceeds about 50 μm, light emission efficiency of the OLED display device 10 may be degraded.

The touch portion TP is disposed on the display portion DP which includes the substrate 110, the driving circuit 130, the pixel defining layer 190, the OLED 210, and the thin film encapsulation layer 301.

The touch portion TP includes a first sensing electrode SE1, a second sensing electrode SE2, a low refractive index layer 450, and a high refractive index layer 470.

The first sensing electrode SE1 is on the thin film encapsulation layer 301. The first sensing electrode SE1 may include a metal or transparent conductive oxide (TCO). Such TCO may include at least one of: indium tin oxide (ITO), indium zinc oxide (IZO), zinc oxide (ZnO), carbon nanotube (CNT), or graphene.

A first insulating layer 410 may be on the thin film encapsulation layer 301 along with the first sensing electrode SE1. The first insulating layer 410 may include at least one of an inorganic layer and an organic layer. The inorganic layer may include at least one of: metal oxide, metal oxynitride, silicon oxide, silicon nitride, and silicon oxynitride. The organic layer may include a polymer-based material, for example.

The second sensing electrode SE2 is on the first insulating layer 410. The second sensing electrode SE2 may include a metal or transparent conductive oxide (TCO). Such TCO may include at least one of: indium tin oxide (ITO), indium zinc oxide (IZO), zinc oxide (ZnO), carbon nanotube (CNT), or graphene.

The touch portion TP according to an exemplary embodiment is described as including the first sensing electrode SE1 and the second sensing electrode SE2 which are on different layers, but exemplary embodiments are not limited thereto. Alternatively, the touch portion TP may include a first sensing electrode SE1 and a second sensing electrode SE2 which are disposed on a substantially same layer and are connected to each other using a bridge electrode.

A second insulating layer 420 may be on the first insulating layer 410 along with the second sensing electrode SE2. The second insulating layer 420 may include at least one of an organic layer and an inorganic layer.

The low refractive index layer 450 is on the second insulating layer 420. The low refractive index layer 450 may include or be formed of a light transmitting organic material having a low refractive index. For example, the low refractive index layer 450 may include at least one of an acrylic resin, a polyimide resin, a polyamide resin, or $Alq_3$ [tris(8-hydroxyquinolinato) aluminum].

The low refractive index layer 450 has a refractive index relatively less than that of the high refractive index layer 470 to be described below. For example, the low refractive index layer 450 may have a refractive index between about 1.40 to about 1.59.

The low refractive index layer 450 may define a second opening 455 that overlaps, e.g., completely overlaps, the first opening 195 along the stacking direction. The second opening 455 may be also defined as a part of an area above the second insulating layer 420 that does not overlap the low refractive index layer 450 along the stacking direction. In addition, a boundary at the second opening 455 at which the low refractive index layer 450 contacts the second insulating layer 429 is defined as an edge 451 of the second opening 455.

The edge 451 of the second opening 455 may have a shape substantially the same as a shape of the edge 191 of the first opening 195 on a plane, e.g., may be conformal therewith. In addition, a size of the second opening 455 may be larger than a size of the first opening 195 on a plane, e.g., may form a conformal boundary around the first opening 195. The above will be described in detail below.

The high refractive index layer 470 is on the second insulating layer 420 and the low refractive index layer 450. The high refractive index layer 470 may include or be formed of a light transmitting organic material having a high refractive index. In particular, the high refractive index layer 470 may overlap, e.g., completely overlap, the first opening 195 along the stacking direction.

The high refractive index layer 470 has a refractive index relatively higher than that of the low refractive index layer 450. For example, the high refractive index layer 470 may have a refractive index between about 1.60 to about 1.80.

In addition, the OLED display device 10 according to an exemplary embodiment may further include a polarizer, an adhesive layer, and a window on the touch portion TP.

As the touch portion TP according to an exemplary embodiment includes the low refractive index layer 450 defining the second opening 455 and the high refractive index layer 470 in contact, e.g., direct contact, with the low refractive index layer 450, the front visibility and the light emission efficiency of the OLED display device 10 may be improved. In other words, at least a part of the light generated in the OLED 210 may be reflected from the interface between the low refractive index layer 450 and the high refractive index layer 470 due to a difference in refractive index therebetween, such that light may be condensed or directed toward the front surface, which will be described in detail below with reference to FIG. 5.

Figure 5:
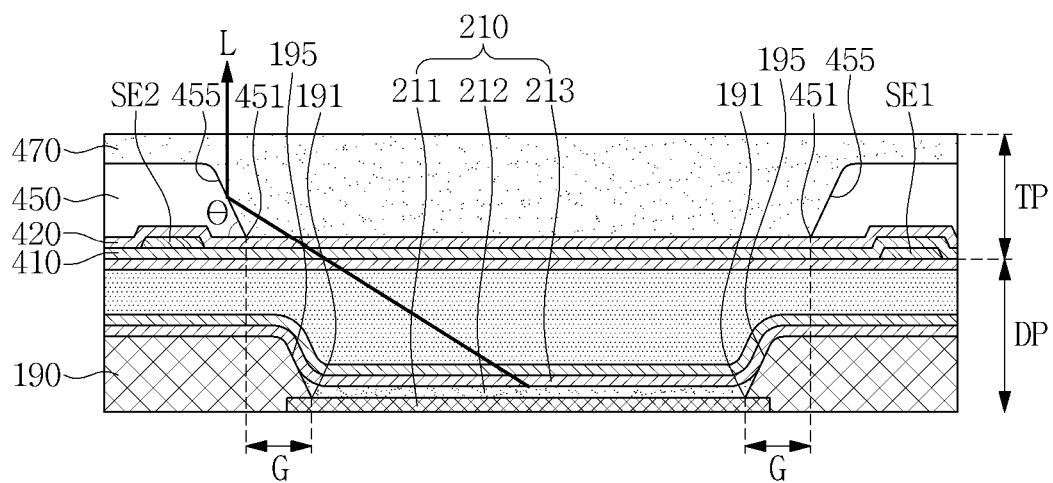
FIG. 5 illustrates a cross-sectional view for explaining light reflection at an interface between a low refractive index layer and a high refractive index layer.

FIG. 5 illustrates a cross-sectional view for explaining light reflection at an interface between a low refractive index layer and a high refractive index layer. For convenience of explanation, the substrate and the driving circuit are omitted from FIG. 5.

Referring to FIG. 5, light L generated in the organic light emitting layer 212 may be incident on the touch portion TP at an inclination, e.g., at an angle with respect to a line parallel to the substrate 110. In such an exemplary embodiment, at least a part of the light L incident on the high refractive index layer 470 of the touch portion TP is reflected from the interface between the low refractive index layer 450 and the high refractive index layer 470. In particular, as illustrated in FIG. 5, when an angle of the light L incident on the high refractive index layer 470 is larger than a critical angle, the incident light L may be totally reflected from the interface between the low refractive index layer 450 and the high refractive index layer 470. That is, since the light L incident on the high refractive index layer 470, which has a relatively high refractive index, propagates to the low refractive index layer 450, which has a relatively small refractive index, the light L may be totally reflected from the interface between the low refractive index layer 450 and the high refractive index layer 470.

In such an exemplary embodiment, the interface between the low refractive index layer 450 and the high refractive index layer 470 forms an angle between about 40° to about 70° with respect to a straight line parallel to the substrate 110. The interface between the low refractive index layer 450 and the high refractive index layer 470 may be a side surface of the low refractive index layer 450 that defines the second opening 455. In other words, the side surface of the low refractive index layer 450 may form, on a cross-section, an angle ranging from about 40° to about 70° with respect to the second insulating layer 420 on which the low refractive index layer 450 is disposed.

When the angle is less than about 40°, the light L may not be incident to the interface between the low refractive index layer 450 and the high refractive index layer 470, such that the total reflection may not occur. On the other hand, when the angle is larger than about 70°, the light L totally reflected from the interface between the low refractive index layer 450 and the high refractive index layer 470 may not be emitted toward the front surface of the OLED display device 10.

That is, according to an exemplary embodiment, as the interface between the low refractive index layer 450 and the high refractive index layer 470 forms an angle between about 40° to about 70° with respect to a straight line parallel to the substrate 110, the light L incident to the interface between the low refractive index layer 450 and the high refractive index layer 470 may be totally reflected. Accordingly, the light L may be condensed or directed toward the front surface of the OLED display device 10, and the front visibility and the light emission efficiency may be improved.

In addition, the first opening 195 according to an exemplary embodiment has a size less than a size of the second opening 455 on a plane. A gap G between the edge 191 of the first opening 195 and the edge 451 of the second opening 455 may be between about 0.5 μm to about 5.0 μm on a plane. In addition, the gap G between the edge 191 of the first opening 195 and the edge 451 of the second opening 455 according to an exemplary embodiment is invariably constant irrespective of the direction, which will be described in detail with reference to FIGS. 6A and 6B.

Figure 6A:
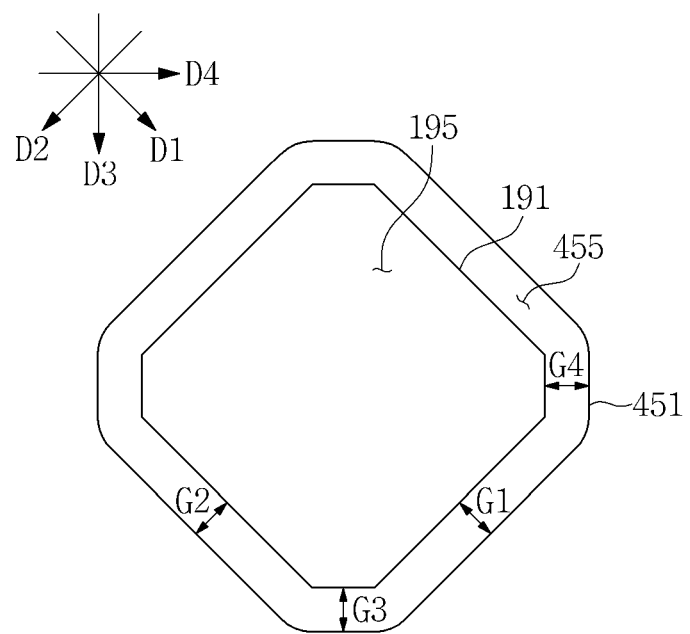
FIG. 6A illustrates a plan view of a first opening and a second opening according to an exemplary embodiment.
Figure 6B:
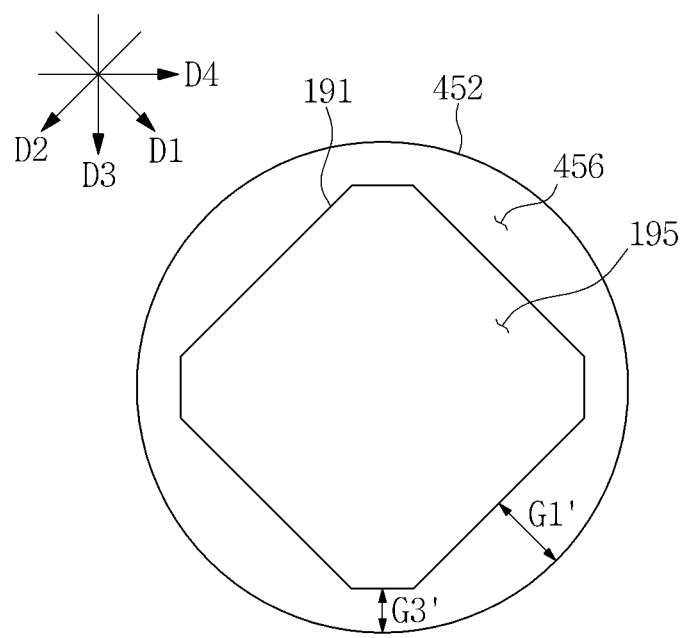
FIG. 6B illustrates a plan view of a first opening and a second opening of a comparative example.

FIG. 6A is a plan view illustrating a first opening and a second opening according to an exemplary embodiment. FIG. 6B is a plan view illustrating a first opening and a second opening according to a comparative example.

Referring to FIG. 6A, the first opening 195 and the second opening 455 according to an exemplary embodiment have different sizes and have a substantially same shape, on a plane. For example, the first opening 195 may have a size less than the size of the second opening 455 on a plane, and the first opening 195 and the second opening 455 may have a substantially octagonal shape similar to a rhombus.

The gap G between the edge 191 of the first opening 195 and the edge 451 of the second opening 455 is invariably constant irrespective of the direction, e.g., are conformal. For example, as illustrated in FIG. 6A, a gap G1 between the edge 191 of the first opening 195 and the edge 451 of the second opening 455 in a first direction D1, a gap G2 between the edge 191 of the first opening 195 and the edge 451 of the second opening 455 in a second direction D2, a gap G3 between the edge 191 of the first opening 195 and the edge 451 of the second opening 455 in a third direction D3, and a gap G4 between the edge 191 of the first opening 195 and the edge 451 of the second opening 455 in a fourth direction D4 are substantially equal to each other. In other words, G1=G2=G3=G4.

Referring to FIG. 6B, illustrates a comparative example in which a first opening 195 and a second opening 456 have different sizes and different shapes on a plane. For example, while the first opening 195 may have a size less than the size of the second opening 456 on a plane, the first opening 195 may have a substantially octagonal shape similar to a rhombus on a plane, and the second opening 456 may have a substantially circular shape on a plane. In other words, the second opening 456 is not conformal to the first opening 195.

Accordingly, a gap G between the edge 191 of the first opening 195 and an edge 452 of the second opening 456 varies depending on the direction, in contrast to that shown in FIG. 6A. For example, as illustrated in FIG. 6B, a gap G1' in the first direction D1 has a value different from that of a gap G3' in the third direction D3. In other words, G1'≠ G3'.

That is, a distance from the organic light emitting layer 212 at the first opening 195 to the interface between the low refractive index layer 450 and the high refractive index layer 470 varies depending on the direction. Accordingly, a reflectance at the interface between the low refractive index layer 450 and the high refractive index layer 470 or a rate of light incident on the interface from the organic light emitting layer 212 may vary. Accordingly, a luminance difference may occur according to the direction, and display quality may be degraded.

However, according to an exemplary embodiment as shown in FIG. 6A, the gap G between the edge 191 of the first opening 195 and the edge 451 of the second opening 455 is invariably constant irrespective of the direction. That is, the distance from the organic light emitting layer 212 at the first opening 195 to the interface between the low refractive index layer 450 and the high refractive index layer 470 is invariably constant irrespective of the direction. Accordingly, the luminance difference according to the direction does not occur, and the display quality of the OLED display device 10 may be improved.

Figure 7:
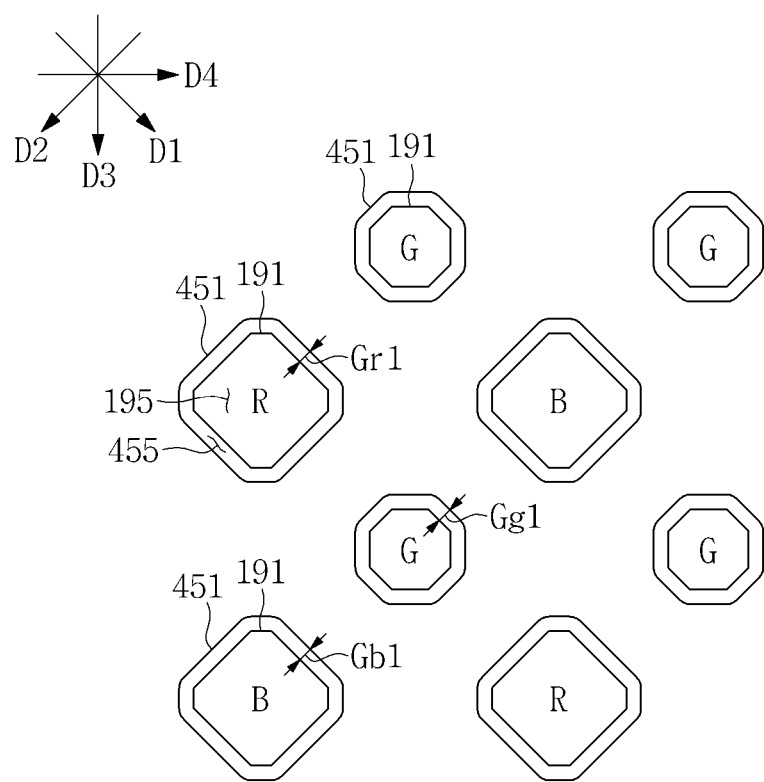
FIG. 7 illustrates a plan view of a plurality of first openings and a plurality of second openings according to an exemplary embodiment.

FIG. 7 is a plan view illustrating a plurality of first openings and a plurality of second openings according to an exemplary embodiment. Referring to FIG. 7, the gap G between the edge 191 of the first opening 195 and the edge 451 of the second opening 455 according to an exemplary embodiment is invariably constant irrespective of pixels PX.

For example, when a gap between the edge 191 of the first opening 195 and the edge 451 of the second opening 455 that overlap the red light emitting layer of the red pixel R is defined as a first gap Gr1, a gap between the edge 191 of the first opening 195 and the edge 451 of the second opening 455 that overlap the greenlight emitting layer of the green pixel G is defined as a second gap Gg1, and a gap between the edge 191 of the first opening 195 and the edge 451 of the second opening 455 that overlap the blue light emitting layer of the blue pixel B is defined as a third gap Gb1, the first gap Gr1, the second gap Gg1, and the third gap Gb1 are substantially equal to each other.

That is, a ratio (Gr1:Gg1:Gb1) between the first gap Gr1, the second gap Gg1, and the third gap Gb1 according to an embodiment is about 1:1:1. Each of the first gap Gr1, the second gap Gg1, and the third gap Gb1 may be between about 0.5 μm to about 5.0 μm. For example, each of the first gap Gr1, the second gap Gg1, and the third gap Gb1 according to an embodiment may be about 1 μm.

Figure 8:
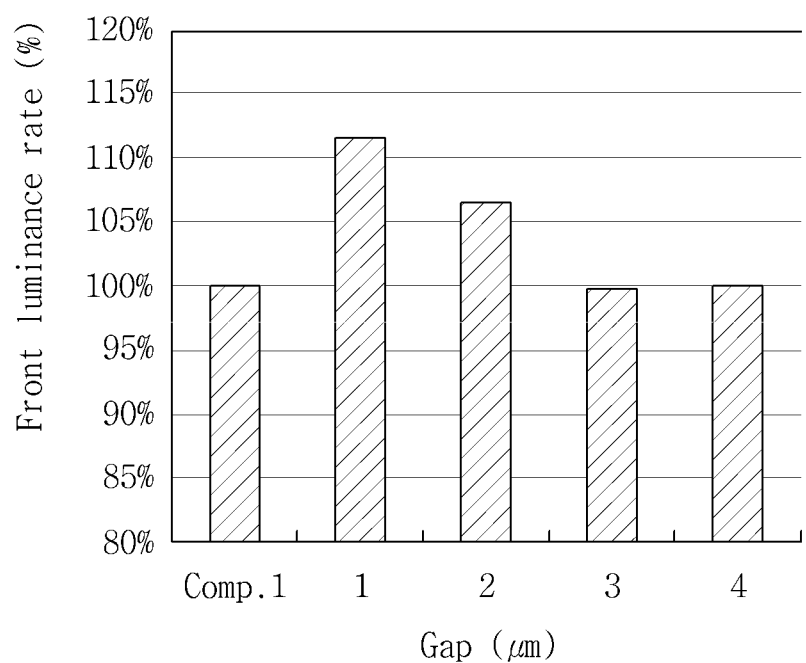
FIG. 8 illustrates a graph showing a front luminance rate depending on a gap between the first opening and the second opening.

FIG. 8 is a graph showing a front luminance rate depending on the gap between the first opening and the second opening. In specific, FIG. 8 shows a graph illustrating the front luminance rate of each case where the gap between the first opening and the second opening is about 1 μm, 2 μm, 3 μm, and 4 μm, when the front luminance rate of Comparative Example Comp. 1 in which the first opening and the second opening have the shape of FIG. 6B is 100%.

Referring to FIG. 8, when the gap G between the edge 191 of the first opening 195 and the edge 451 of the second opening 455 is invariably constant irrespective of the direction, the front luminance rate is similar to or greater than that of the Comparative Example Comp. 1. That is, it may be appreciated that the OLED display device 10 according to an exemplary embodiment may be improved in terms of the front visibility and the light emission efficiency.

In particular, when the gap G between the edge 191 of the first opening 195 and the edge 451 of the second opening 455 is in variably constant at 1 μm irrespective of the direction, the front luminance rate is about 111%, which is about 11% higher than the front luminance rate of the Comparative Example Comp. 1. Further, when the gap G between the edge 191 of the first opening 195 and the edge 451 of the second opening 455 is in variably constant at 2 μm irrespective of the direction, the front luminance rate is about 106%, which is about 6% higher than the front luminance rate of the Comparative Example Comp. However, the gap G between the edge 191 of the first opening 195 and the edge 451 of the second opening 455 according to an exemplary embodiment of may be variously changed according to the specification of the OLED display device 10.

Hereinafter, another embodiment will be described with reference to FIG. 9. The description of the same configuration as that of an embodiment will be omitted for the convenience of explanation.

Figure 9:
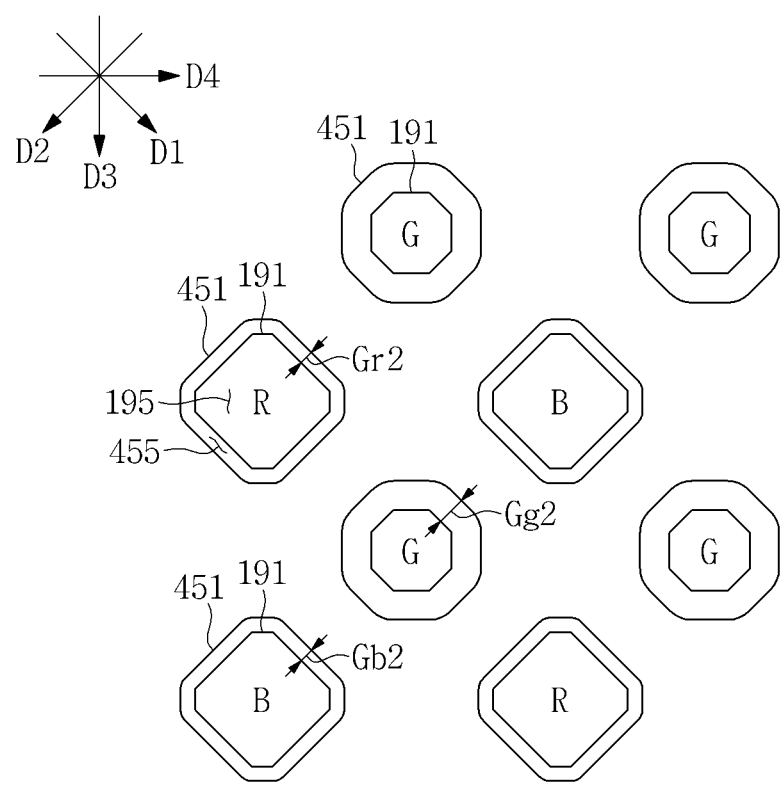
FIG. 9 illustrates a plan view of a plurality of first openings and a plurality of second openings according to another exemplary embodiment.

FIG. 9 is a plan view showing a plurality of first openings and a plurality of second openings according to another embodiment. Referring to FIG. 9, the gap G between the edge 191 of the first opening 195 and the edge 451 of the second opening 455 according to another exemplary embodiment may vary depending on the pixel PX corresponding thereto. In other words, different color pixels may have different gaps, while same color pixels may have a same gap.

For example, when a gap between the edge 191 of the first opening 195 and the edge 451 of the second opening 455 that overlap the red light emitting layer of the red pixel R is defined as a first gap Gr2, a gap between the edge 191 of the first opening 195 and the edge 451 of the second opening 455 that overlap the greenlight emitting layer of the green pixel G is defined as a second gap Gg2, and a gap between the edge 191 of the first opening 195 and the edge 451 of the second opening 455 that overlap the blue light emitting layer of the blue pixel B is defined as a third gap Gb2, the first gap Gr2, the second gap Gg2, and the third gap Gb2 may have values different from each other.

In such an exemplary embodiment, a ratio (Gr2:Gg2:Gb2) between the first gap Gr2, the second gap Gg2, and the third gap Gb2 according to another exemplary embodiment is about 1:2:1. However, exemplary embodiments are not limited thereto, and the ratio (Gr2:Gg2:Gb2) between the first gap Gr2, the second gap Gg2, and the third gap Gb2 may be variously changed according to the specification of the OLED display device 10, for example, to 1:2:2 or 2:2:1.

In addition, each of the first gap Gr2, the second gap Gg2, and the third gap Gb2 may be between about 0.5 μm to about 5.0 μm. For example, according to an exemplary embodiment, the first gap Gr2 may be about 1 μm, the second gap Gg2 may be about 2 μm, and the third gap Gb2 may be about 1 μm.

Figure 10A:
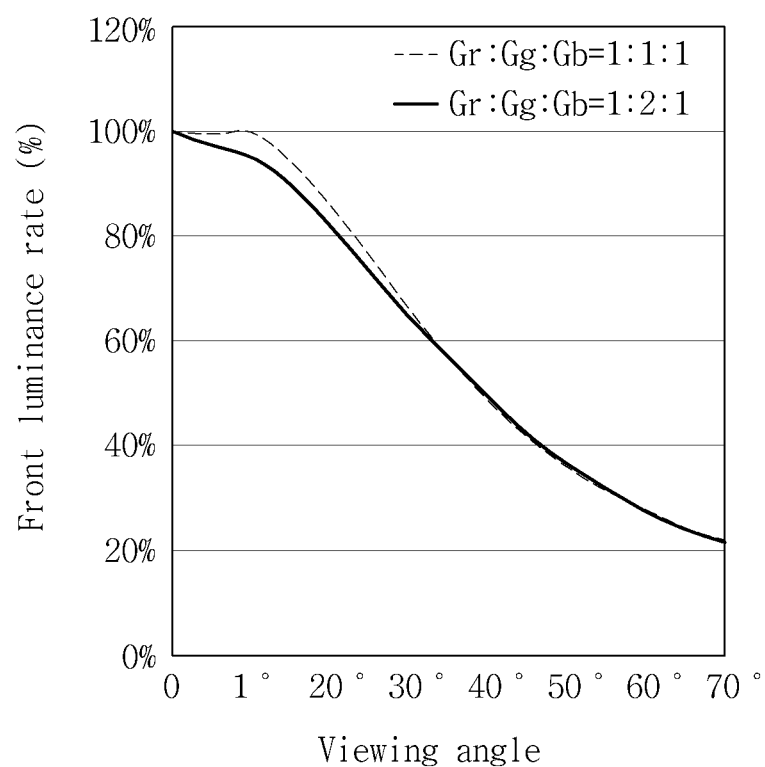
FIG. 10A illustrates a graph showing a luminance rate depending on a viewing angle.
Figure 10B:
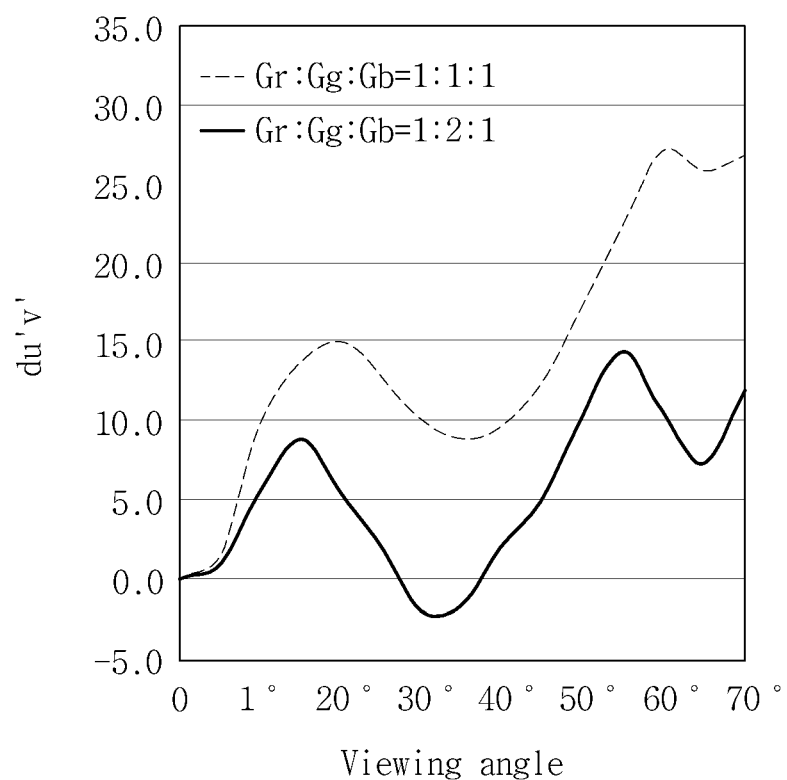
FIG. 10B illustrates a graph showing color shift depending on a viewing angle.

FIG. 10A is a graph showing a luminance rate depending on a viewing angle, and FIG. 10B is a graph showing color shift depending on a viewing angle. In specific, FIG. 10A shows a graph illustrating a luminance rate depending on the viewing angle when the first opening and the second opening have the shapes of FIGS. 7 and 9, and FIG. 10B shows a graph illustrating color shift according to the viewing angle when the first opening and the second opening have the shapes of FIGS. 7 and 9.

Referring to FIG. 10A, the front visibility and the light emission efficiency are improved when the ratio (Gr:Gg:Gb) between the first gap Gr, the second gap Gg, and the third gap Gb is about 1:1:1, as compared to the case where the ratio (Gr:Gg:Gb) between the first gap Gr, the second gap Gg and the third gap Gb is about 1:2:1.

On the other hand, referring to FIG. 10B, color shift according to the viewing angle is reduced when the ratio (Gr:Gg:Gb) between the first gap Gr, the second gap Gg and the third gap Gb is about 1:1:1, as compared to the case where the ratio (Gr:Gg:Gb) between the first gap Gr, the second gap Gg, and the third gap Gb is about 1:2:1. Accordingly, the first gap Gr2, the second gap Gg2, and the third gap Gb2 may be freely set in consideration of the front visibility, the light emission efficiency, and the color shift according to the viewing angle.

Hereinafter, still another embodiment of will be described with reference to FIG. 11. The description of the same configuration as that of an embodiment will be omitted for convenience of explanation.

Figure 11:
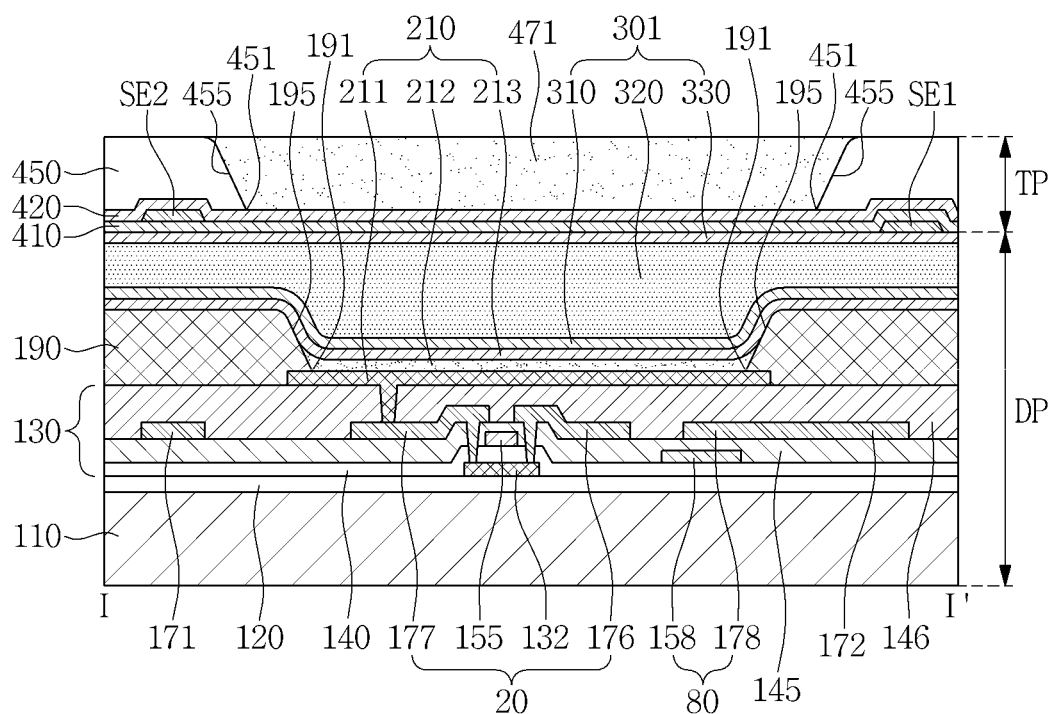
FIG. 11 illustrates a cross-sectional view of an OLED display device according to still another exemplary embodiment.

FIG. 11 illustrates a cross-sectional view an OLED display device according to still another exemplary embodiment. Referring to FIG. 11, the low refractive index layer 450 according to still another exemplary embodiment has a height substantially equal to a height of the high refractive index layer 471. In other words, the high refractive index layer 471 is only at the second opening 455 which is defined by the low refractive index layer 450, e.g., to completely overlap the first opening 195, and is not on the low refractive index layer 450.

The OLED display device according to still another exemplary embodiment may have a thickness less than the thickness of the OLED display device according to an embodiment. Accordingly, the flexible characteristics of the OLED display device may be improved.

As set forth hereinabove, according to one or more exemplary embodiments, light emission efficiency and display quality of the OLED display device may be improved.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. An organic light emitting display device, comprising:
   a substrate;
   a plurality of first electrodes on the substrate;
   a pixel defining layer on the substrate, the pixel defining layer defining a plurality of first openings, a first one of the first openings exposing at least a part of a first one of the first electrodes and a second one of the first openings directly adjacent to the first one of the first openings exposing at least a part of a second one of the first electrodes;
   an organic light emitting layer on each of the first electrodes;
   a second electrode on the organic light emitting layer;
   a sensing electrode on an upper side of the second electrode and offset from the first one of the first openings and the second one of the first openings such that the sensing electrode does not overlap the first and second one of the first openings; and
   a first organic layer on the sensing electrode, the first organic layer defining a plurality of second openings, a first one of the second openings overlapping the first one of the first openings and a second one of the second openings overlapping the second one of the first openings,
   wherein a smallest width of a first gap between an edge of the first one of the first openings and an edge of the first one of the second openings in a plan view is different from a smallest width of a second gap between an edge of the second one of the first openings and an edge of the second one of the second openings in the plan view.

2. The organic light emitting display device as claimed in claim 1, wherein a size of the first openings is less than a size of the corresponding second openings on a plane.

3. The organic light emitting display device as claimed in claim 1, wherein the first openings are in the corresponding second openings in the plan view.

4. The organic light emitting display device as claimed in claim 1, wherein the first openings have a shape substantially the same as a shape of the second openings on a plane.

5. The organic light emitting display device as claimed in claim 1, wherein the first organic layer comprises a light transmitting organic material.

6. The organic light emitting display device as claimed in claim 1, wherein the first organic layer has a refractive index between about 1.40 and about 1.59.

7. The organic light emitting display device as claimed in claim 1, wherein the first organic layer overlaps the pixel defining layer.

8. The organic light emitting display device as claimed in claim 5, further comprising a second organic layer in the second openings.

9. The organic light emitting display device as claimed in claim 8, wherein the second organic layer comprises a light transmitting organic material.

10. The organic light emitting display device as claimed in claim 9, wherein the second organic layer has a refractive index higher than that of the first organic layer.

11. The organic light emitting display device as claimed in claim 10, wherein the second organic layer has a refractive index between about 1.60 and about 1.80.

12. The organic light emitting display device as claimed in claim 8, wherein an interface between the first organic layer and the second organic layer forms an angle between about 40° and about 70° with respect to a plane parallel to the substrate.

13. The organic light emitting display device as claimed in claim 8, wherein the second organic layer is on the first organic layer.

14. The organic light emitting display device as claimed in claim 8, wherein the second organic layer has a height substantially equal to a height of the first organic layer.

15. The organic light emitting display device as claimed in claim 1, wherein:
- each of an edge of the first openings and an edge of the corresponding second openings forms a closed loop, and
- the closed loop has a substantially circular, rhombic or octagonal shape on a plane.

16. The organic light emitting display device as claimed in claim 1, wherein the smallest width of the first gap and the smallest width of the second gap are each in a range between about 0.5 μm and about 5.0 μm in the plan view, and
- wherein the smallest width of the second gap is twice as large as the smallest width of the first gap.

17. The organic light emitting display device as claimed in claim 1, wherein the sensing electrode includes a first sensing electrode and a second sensing electrode crossing each other.

18. The organic light emitting display device as claimed in claim 17, wherein the sensing electrode has a mesh shape.

19. The organic light emitting display device as claimed in claim 1, further comprising a thin film encapsulation layer between the second electrode and the sensing electrode.

20. The organic light emitting display device as claimed in claim 1, wherein the sensing electrode is outside of each of the first openings and each of the second openings.

* * * * *